(12) United States Patent
Meiser et al.

(10) Patent No.: US 8,963,244 B2
(45) Date of Patent: Feb. 24, 2015

(54) SEMICONDUCTOR DEVICE, INTEGRATED CIRCUIT AND METHOD OF MANUFACTURING A SEMICONDUCTOR DEVICE

(71) Applicant: Infineon Technologies Austria AG, Villach (AT)

(72) Inventors: Andreas Meiser, Sauerlach (DE); Till Schloesser, Munich (DE); Anton Mauder, Kolbermoor (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/894,751

(22) Filed: May 15, 2013

(65) Prior Publication Data

US 2014/0339633 A1 Nov. 20, 2014

(51) Int. Cl.
*H01L 29/78* (2006.01)
*H01L 29/66* (2006.01)

(52) U.S. Cl.
CPC ...... *H01L 29/7825* (2013.01); *H01L 29/66704* (2013.01)
USPC .......................... 257/343; 257/288; 438/262

(58) Field of Classification Search
CPC .............. H01L 21/76224; H01L 29/0653; H01L 29/7813; H01L 29/7804; H01L 29/66734; H01L 29/7397; H01L 29/4236; H01L 29/4238
USPC .................. 257/E29.133, E29.021, E29.256, 257/E29.136, E29.027, 330, 343, 335, 492, 257/E29.121, 341, 502, E29.008, 289, 242
See application file for complete search history.

(56) References Cited

U.S. PATENT DOCUMENTS 7,221,011 B2 * 5/2007 Banerjee et al. .............. 257/288
8,110,868 B2 * 2/2012 Pfirsch et al. ................. 257/328

FOREIGN PATENT DOCUMENTS

| DE | 102006009942 A1 | 9/2007 |
| WO | 2007012490 A2 | 2/2007 |

* cited by examiner

*Primary Examiner* — Zandra Smith
*Assistant Examiner* — Paul Patton
(74) *Attorney, Agent, or Firm* — Murphy, Bilak & Homiller, PLLC

(57) ABSTRACT

A semiconductor device includes a transistor. The transistor includes a source region, a drain region, a body region, a drift zone, and a gate electrode adjacent to the body region. The body region, the drift zone, the source region and the drain region are disposed in a first semiconductor layer having a first main surface. The body region and the drift zone are disposed along a first direction between the source region and the drain region, the first direction being parallel to the first main surface. Trenches are disposed in the first semiconductor layer, the trenches extending in the first direction. The transistor further includes a drift control region arranged adjacent to the drift zone. The drift control region and the gate electrode are disposed in the trenches.

24 Claims, 11 Drawing Sheets

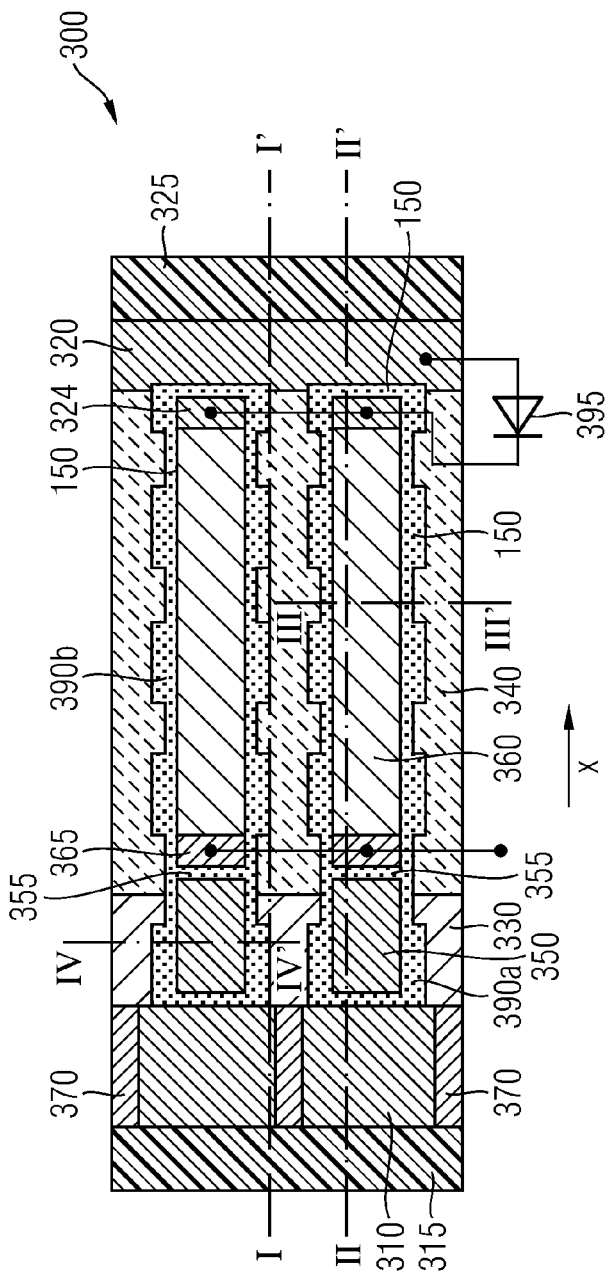
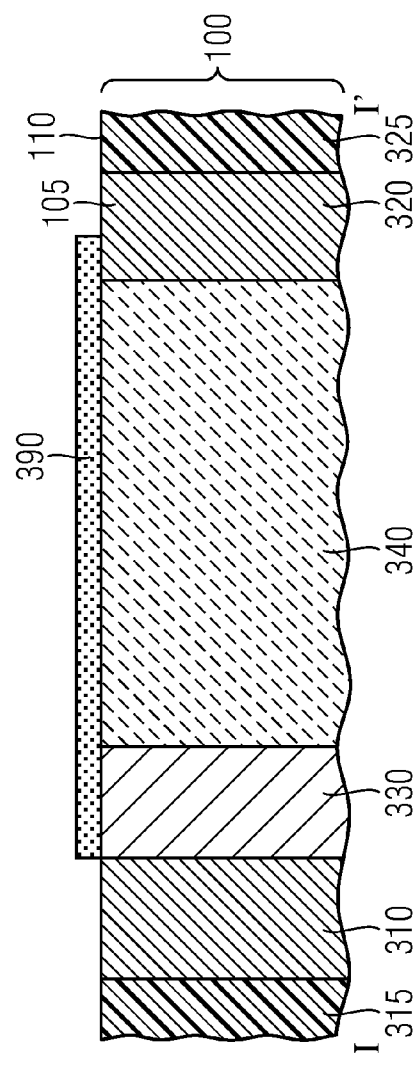
FIG 1A
FIG 1B

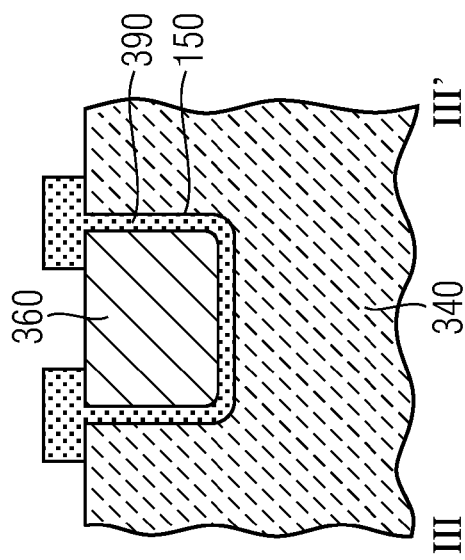
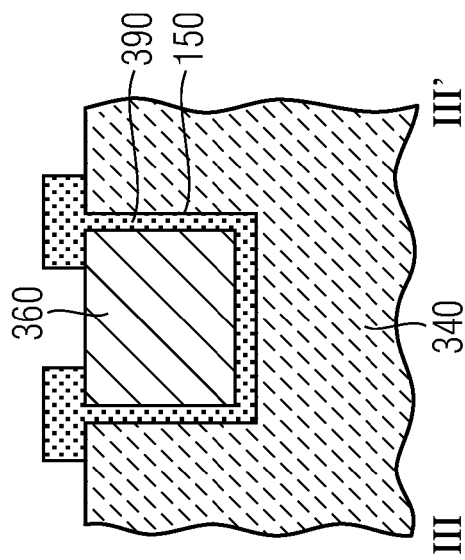

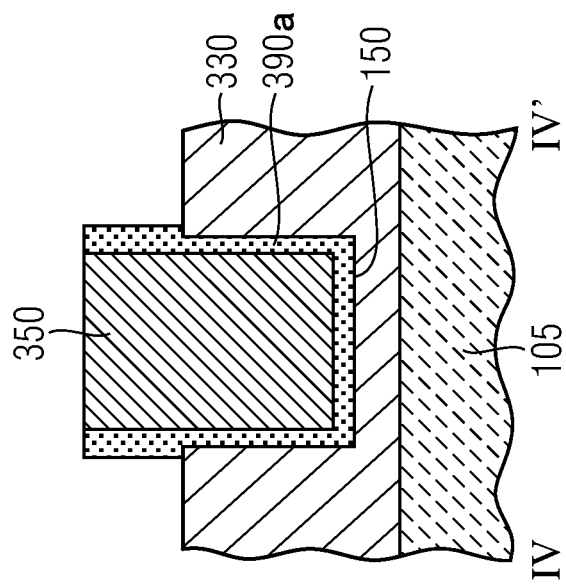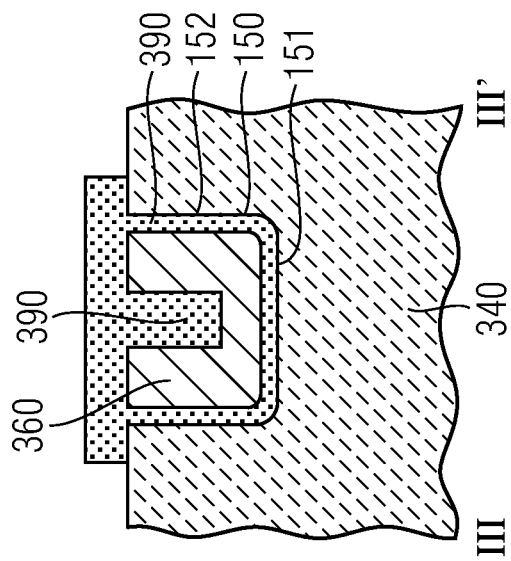

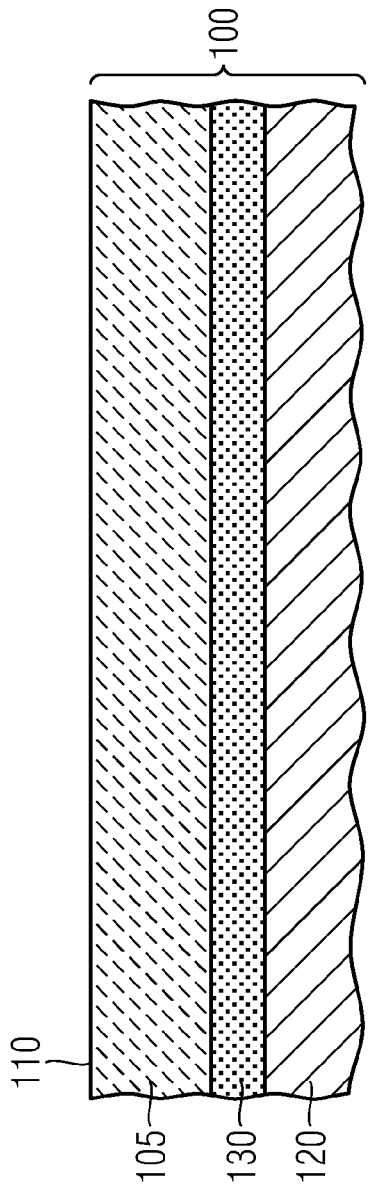
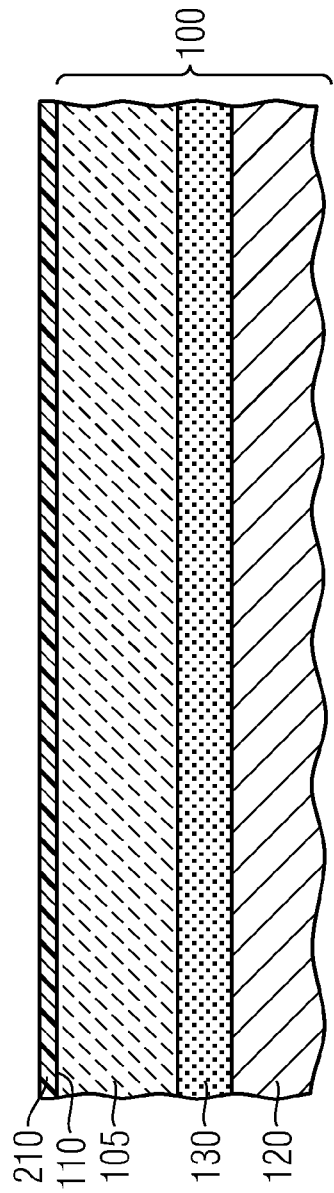
FIG 4A
FIG 4B

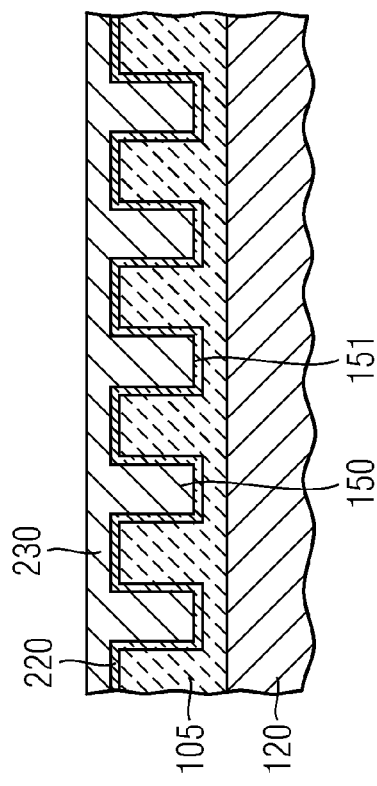
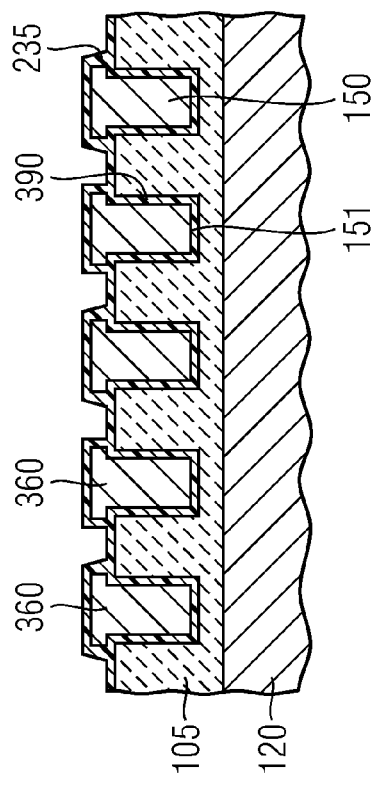
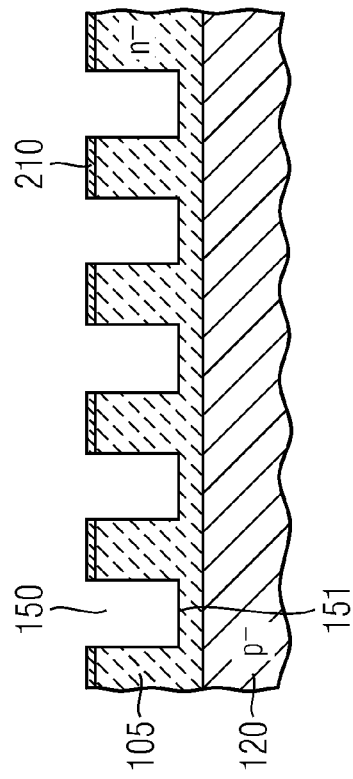
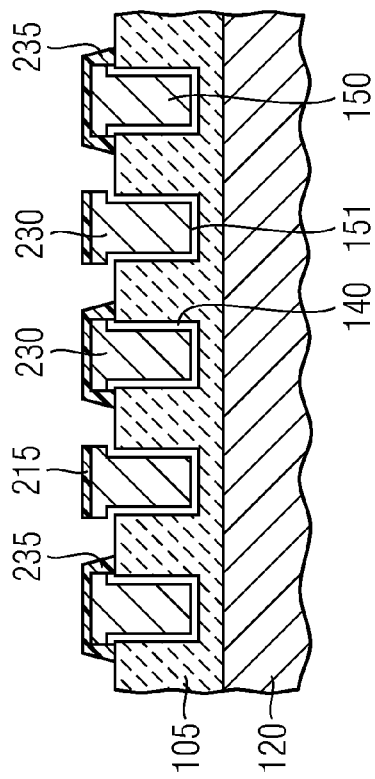

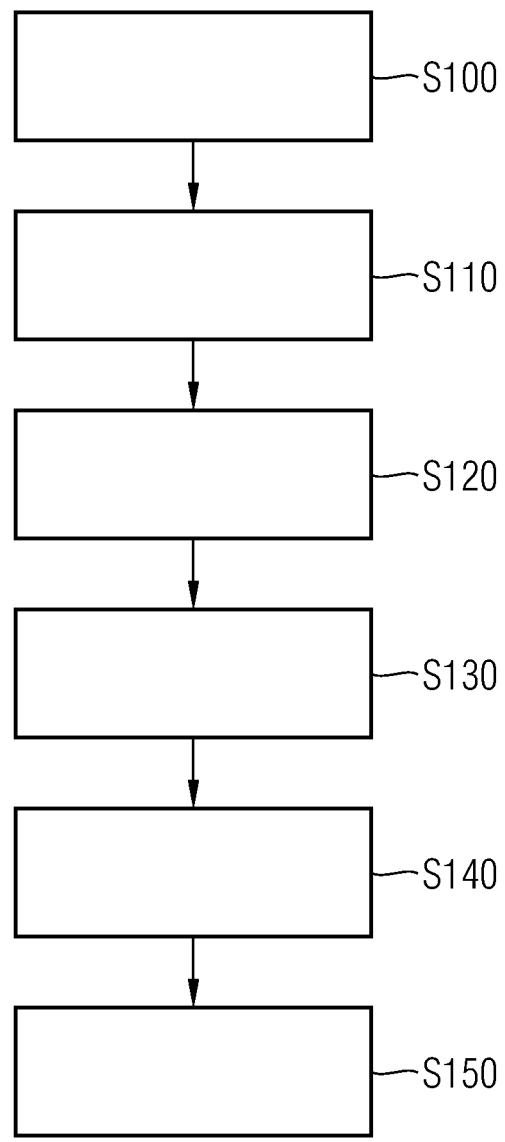

SEMICONDUCTOR DEVICE, INTEGRATED CIRCUIT AND METHOD OF MANUFACTURING A SEMICONDUCTOR DEVICE

BACKGROUND

Power transistors commonly employed in automotive and industrial electronics require a low on-state resistance ($R_{on}$), while securing a high voltage blocking capability. For example, a MOS ("metal oxide semiconductor") power transistor should be capable, depending upon application requirements to block drain to source voltages $V_{ds}$ of some tens to some hundreds or thousands volts of volts. MOS power transistors typically conduct very large currents which may be up to some hundreds of Amperes at typical gate-source voltages of about 2 to 20 V.

Lateral power devices, in which current flow mainly takes place parallel to a first main surface of a semiconductor substrate, are useful for integrated circuits in which further components, such as switches, bridges and control circuits are integrated.

So-called TEDFETs ("Trench Extended Drain Field Effect Transistors") have been developed in order to accomplish a power device having an improved trade-off between low on-state resistance and high voltage blocking capability. TEDFETs specifically rely on the effect of accumulation in the drift region of a field effect transistor (FET).

In view of the above, there is a need for a lateral MOS power transistor which can be manufactured by a simple and cheap process.

SUMMARY

According to an embodiment, a semiconductor device includes a transistor, the transistor comprising a body region, a drift zone, a source region and a drain region in a first semiconductor layer having a first main surface, the body region and the drift zone being disposed along a first direction between the source region and the drain region, the first direction being parallel to the first main surface, and trenches in the first semiconductor layer and extending in the first direction. The transistor further comprises a gate electrode adjacent to the body region and a drift control region adjacent to the drift zone. The drift control region and the gate electrode are disposed in the trenches.

According to an embodiment, a method of manufacturing a semiconductor device comprising a transistor includes forming trenches in a first semiconductor layer having a first main surface, the trenches extending in a first direction, the first direction being parallel to the first main surface, and forming a body region, a drift zone, a source region and a drain region in a first semiconductor layer so that the body region and the drift zone are disposed along the first direction between the source region and the drain region and between adjacent trenches. The method further comprises forming a gate electrode and a drift control region in each of the trenches so that the gate electrode is adjacent to the body region and the drift control region is arranged adjacent to the drift zone.

According to an embodiment, a method of manufacturing a semiconductor device comprising a transistor includes forming trenches in a first semiconductor layer having a first main surface, the trenches extending in a first direction, the first direction being parallel to the first main surface, forming a sacrificial layer over the first main surface after forming the trenches, a material of the sacrificial layer being different from the material of the first semiconductor layer, epitaxially forming a second semiconductor layer over the sacrificial layer, a material of the second semiconductor layer being different from the material of the sacrificial layer, removing the sacrificial layer, forming a dielectric layer between the first and the second semiconductor layer, and forming a source region, a drain region, and a gate electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 1A to 1G illustrate various views of a semiconductor device according to an embodiment;

FIGS. 4A to 4F illustrates a first method of manufacturing a semiconductor device;

FIGS. 5A to 5D illustrate a method of manufacturing a semiconductor device according to a further embodiment;

FIGS. 6A and 6B illustrate portions of a method of manufacturing a semiconductor device.

DETAILED DESCRIPTION

Figure 1C:
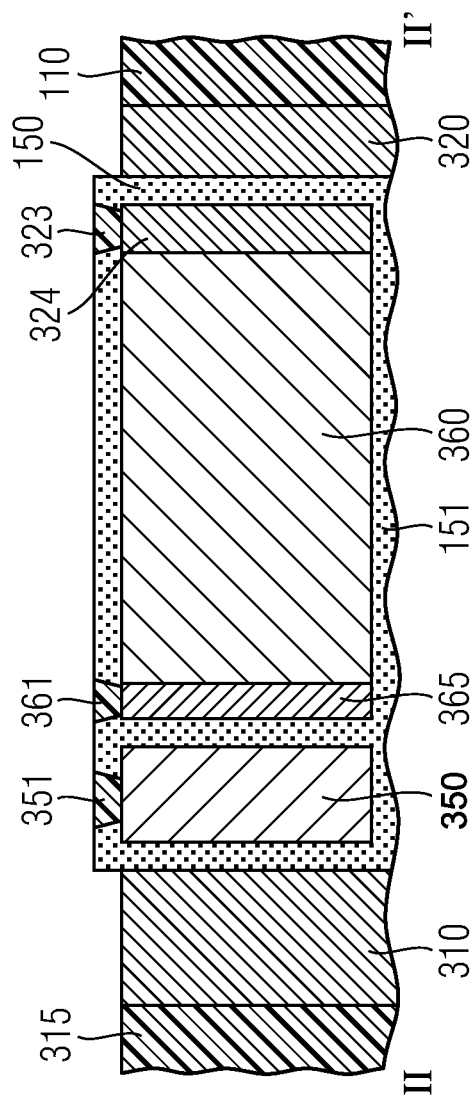

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

The term "vertical" as used in this specification intends to describe an orientation which is arranged perpendicular to the first surface of the semiconductor substrate or semiconductor body.

The terms "lateral" and "horizontal" as used in this specification intends to describe an orientation parallel to a first surface of a semiconductor substrate or semiconductor body. This can be for instance the surface of a wafer or a die.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIGS. 1A to 1G illustrate various views of a semiconductor device according to an embodiment.

FIG. 1A illustrates a plan view of a semiconductor device 300. The semiconductor device 300 shown in FIG. 1A comprises a transistor. The transistor comprises a source region 310, a drain region 320, a body region 330, and a drift zone 340. The transistor further comprises a gate electrode 350 that is adjacent to the body region 330. The body region 330, the drift zone 340, the source region 310 and the drain region 320 are disposed in a first semiconductor layer 105 having a first main surface 110. The body region 330 and the drift zone 340 are disposed along a first direction (the x direction illustrated in FIG. 1A) between the source region 310 and the drain region 320. The first direction is parallel to the first main surface 110.

Further, trenches 150 are disposed in the first semiconductor layer 105 and extend in the first direction. The transistor further comprises a drift control region 360 that is arranged adjacent to the drift zone 340. The drift control region 360 and the gate electrode 350 are disposed in the trenches 150. The gate electrode 350 is insulated from the body region 330 by means of a gate dielectric 390a which may, for example, comprise silicon oxide as is conventional. The drift control region 360 is insulated from the drift region 340 by means of a dielectric layer 390b. For example, the dielectric layer 390b between the drift control region 360 and the drift region 340 and the gate dielectric 390a may have the same thickness and composition. The semiconductor device of FIG. 1A may further comprise a body contact 370 in contact with the body region 330. For example, the body contact 370 may be implemented by a doped portion of the second conductivity type disposed adjacent to the first main surface 110. According to further implementations, the body contact 370 may be disposed beneath the first main surface 110.

The source and the drain regions 310, 320 may be of the first conductivity type, for example, n⁺-doped and the body region 330 may be of the second conductivity type, for example, p-doped. Further, the drift region 340 may be doped with dopants of the first conductivity type, for example, at a lower impurity concentration than the source and the drain regions 310, 320. Further, a metallization layer 315, 325 or another layer of a material having a high conductivity may be disposed in contact with the source region 310 and the drain region 320, respectively. For example, the metallization layer 315 in contact with the source region 310 may form the source electrode and the metallization layer 325 in contact with the drain region 320 may form the drain electrode.

In the embodiment of FIG. 1A, the drift control region 360 may be doped with the first conductivity type, at a lower doping concentration than the doping concentration of the drain region 320. The doping concentration of the drift control region 360 may be equal to, lower than or higher than the impurity concentration of the drift region 340.

Further, the gate electrode 350 may be doped with dopants of the first conductivity type. According to the embodiment shown in FIG. 1A, a separating layer 355 made of an insulating material is disposed between the gate electrode 350 and the drift control region 360. According to the embodiment, the drift control region 360 comprises a contact doped portion 365 which is doped with the second conductivity type in order to accomplish a contact to a suitable external potential. A pn junction is formed between the contact doped portion 365 and the drift control region 360.

The drift control region 360 may have the same doping concentration or a lower doping concentration than the drift region 340. According to still a further embodiment, the drift control region 360 may be undoped. A portion of the drift control region 360 adjacent to the drain region 320 is heavily doped to form a drain contact doped portion 324. The drain contact doped portion 324 is connected with the drain region 320 by means of a reverse biased diode 395. For example, the diode 395 may be accomplished by a doped portion of the second conductivity type (not shown in FIG. 1A) in contact with the drain contact doped portion 324. The drain region 320 may be connected with the doped portion of the second conductivity type of the diode 395 by means of an ohmic contact. Since a pn junction having a forward direction from the gate electrode 350 to the drift control region 360 is formed between the gate electrode 350 and the drift control region 360, it is possible to hold the drift control region 360 at a higher voltage than the gate electrode 350. Usually the potential of the drift control region 360 varies within the drift control region 360.

When an on-voltage is applied to the gate electrode 350, an inversion layer and, consequently, a conductive channel is formed at the boundary between the body region 330 and the gate dielectric layer 390a. Since the drift control region 360 is connected with the gate electrode 350 and the drain region 320, the drift control region 360 is held at a higher potential than or at an equal potential as the gate electrode 350. In this case, an accumulation layer is formed in the drift region 340 at a boundary to the dielectric layer 390b. Due to the complementary doping type of the drift region 340 in comparison to the body region 330, an accumulation layer is formed at the boundary to the dielectric layer 390b. Accordingly, the transistor is in a conducting state from the source region 310 to the drain region 320 via the conductive channel formed in the body region 330 and the accumulation region formed in the drift region 340. In the accumulation region, the number of carriers is increased in comparison to a case in which no field effect is exhibited. As a consequence, the conductivity of the drift region 340 is increased. Due to the increased conductivity, the doping concentration of the drift region 340 may be reduced, thereby improving the breakdown voltage.

In an off-state, no conductive channel is formed in the body region 330 at the boundary to the gate dielectric layer 390a. Further, a depletion zone is formed at the boundary between the drift region 340 and the dielectric layer 390b. Accordingly, charge carriers are removed from the drift region 340, resulting in a blocking of the current flow at a high breakdown voltage. Further, the drift control region 360 is depleted so that the drift control region 360 no longer acts as an electrode that might influence the conductivity of the adjacent drift region 340.

As has been explained above, the concept of the drift control region is different from that of a field plate. Since in an off-state the drift control region 360 is depleted and, hence, does not act as an electrode, the thickness of the dielectric layer 390b between the drift region 340 and the drift control region 360 may be smaller than the thickness of a dielectric layer between a conventionally employed field plate and the drift region. For example, the thickness of the dielectric layer 390b between the drift region 340 and the drift control region 360 may be approximately equal to the thickness of the gate dielectric layer 390a. According to an embodiment, the semiconductor material that forms the gate electrode 350 and the drift control region 360 comprises monocrystalline semiconductor material. In particular, the drift control region 360 may comprise monocrystalline semiconductor material. As a consequence, the material of the drift control region 360 has no grain boundaries. Due to the absence of grain boundaries, the specific conductivity mechanisms necessary for effectively forming the accumulation and the depletion zone in case a corresponding voltage is applied to the drift control region 360 are accomplished. Hence, good breakdown voltage characteristics are obtained and leakage currents between the gate electrode 350 and the drift control region 360 are suppressed. Further, the drift control region 360 may be effectively depleted by applying an off-voltage between the gate electrode 350 and the drain region 320.

FIG. 1B shows a cross-sectional view of the semiconductor device illustrated in FIG. 1A between I and I'. The cross-sectional view of FIG. 1B is taken across the body region 330 and the drift region 340 along the first direction. As is shown, the body region 330 and the drift region 340 are arranged along the first direction between the source region 310 and the drain region 320. A source electrode 315 is disposed adjacent to the source region 310, and a drain electrode 325 is disposed adjacent to the drain region 320. According to an embodiment, components of the transistor shown in FIG. 1B are formed in a semiconductor substrate 100. A dielectric layer 390 is disposed over a portion of the source region 310, the body region 330, the drift region 340 and a small portion of the drain region 320. These components of the transistor are formed in a first semiconductor layer 105 of the semiconductor substrate 100.

FIG. 1C shows a cross-sectional view between II and II' as can be taken from FIG. 1A. The cross-sectional view of FIG. 1C is taken across the trenches 150. The gate electrode 350 and the drift control region 360 are disposed in the trenches 150. According to the embodiment of FIG. 1C, the gate electrode 350 is doped with the first conductivity type, and the drift control region 360 is doped with the first conductivity type, at a lower doping concentration than the gate electrode 350 and the source and drain regions 310, 320. The drift control region 360 may comprise a contact doped portion 365 as has been explained above. The transistor further comprises a gate contact 351 for connecting the gate electrode 350 to a gate terminal. Further, the drift control region 360 comprises a drift control contact 361 for connecting the drift control region 360 to an appropriate potential. The transistor further comprises a diode contact 323 for connecting the drain contact doped portion 324 with a doped portion of the second conductivity type and the drain region 320.

FIGS. 1D to 1F illustrate cross-sectional views of various implementations of the trench 150 in which the drift control region 360 is disposed. For example, the cross-sectional views of FIG. 1D to 1F may be taken between III and III' as illustrated in FIG. 1A.

According to the embodiment illustrated in FIG. 1D, the trench 150 has a rectangular cross-section. According to the embodiment shown in FIG. 1E, the trench 150 has a curved cross-section. Further, according to the embodiment of FIG. 1F, portions of an insulating material 390 are disposed within the trench 150. The bottom side 151 of the trench 150 may extend to a depth which is smaller than a thickness of the drift region 340. Accordingly, a portion of the drift region 340 is disposed beneath the drift control region 360. As becomes apparent from these cross-sectional views, due to the feature that the drift control region 360 is disposed in the trenches 150, the effective interface between the drift region 340 and the drift control region 360 may be enhanced. Thereby, the characteristics of the semiconductor device may be controlled in an improved manner. Further, according to the embodiment of FIG. 1, the gate electrode 350 and the drift control region 360 may be formed in a single trench. Nevertheless, according to further embodiments, the gate electrode 350 and the drift control region 360 may be disposed separate from each other.

FIG. 1G illustrates a cross-sectional view of the gate electrode 350 between IV and IV' as is also illustrated in FIG. 1A. The gate electrode 350 is disposed in a trench 150. Thereby, the effective interface between the gate electrode 350 and the body region 330 may be enhanced. As a consequence, the channel formed at the interface between the body region 330 and the gate electrode 350 may be controlled more efficiently. The gate dielectric material 390a is disposed between the body region 330 and the gate electrode 350. As is illustrated, the bottom side of the body region 330 may extend below the bottom side of the gate electrode 350. According to a further embodiment, the body region 330 may extend to a smaller depth. The gate electrode 350 may be disposed in the same trenches 150 as the drift control region 360. Accordingly, the cross-sectional shape of the gate electrode 350 may be equal to or similar to the cross-sectional shape of the drift control region 360.

Figure 2A:
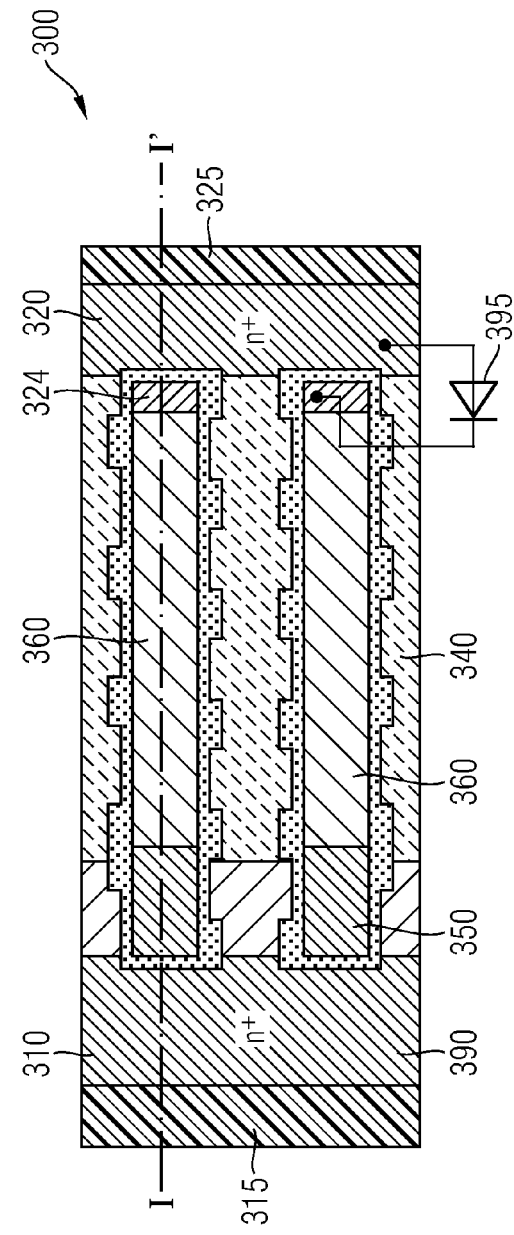
FIGS. 2A and 2B illustrate views of a semiconductor device according to a further embodiment.

FIG. 2A illustrates a further embodiment which is similar to the embodiment illustrated in FIGS. 1A to 1G. Nevertheless, differing from the embodiment shown in FIGS. 1A to 1D, the gate electrode 350 is in physical contact with and electrically coupled to the drift control region 360. According to this embodiment, the gate electrode may 350 be of the second conductivity type, and the drift control region 360 may be doped with dopants of the first conductivity type. Further, according to the embodiment of FIG. 2A, the source region 310 is not patterned but formed as a continuous portion.

Figure 2B:
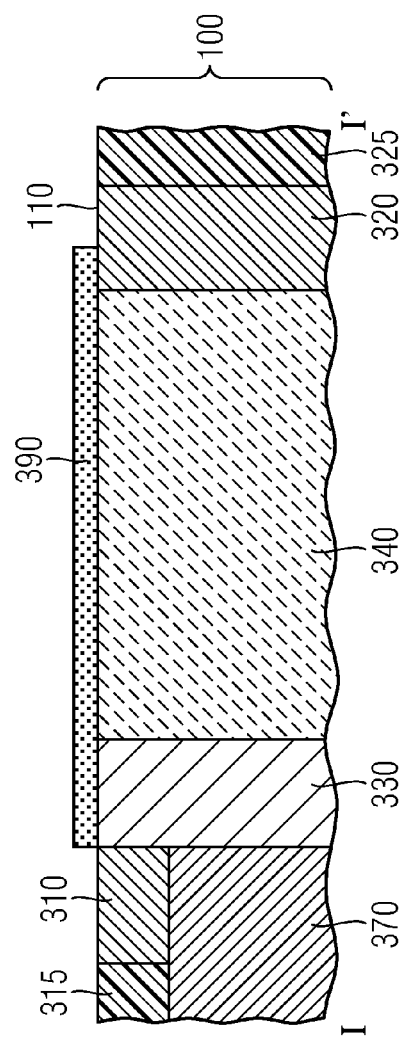

FIG. 2B shows a cross-sectional view of the embodiment shown in FIG. 2A. The cross-sectional view of FIG. 2B is similar to the cross-sectional view shown in FIG. 1B. Nevertheless, differing from the embodiment of FIG. 1B, the body contact 370 is connected with the body region 330 and is implemented by a buried doped region.

Figure 3:
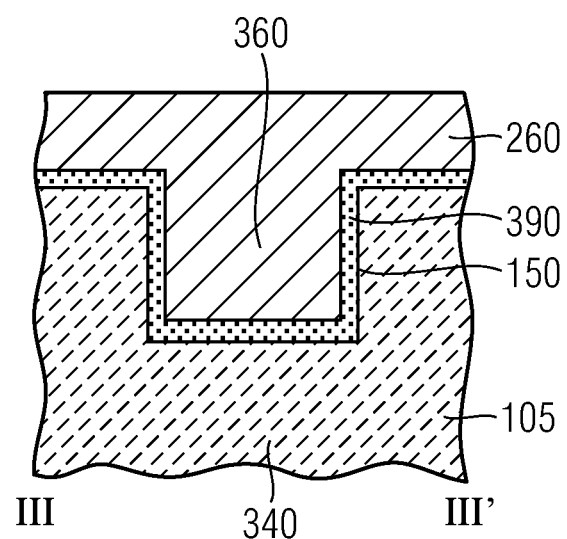
FIG. 3 illustrates views of the semiconductor device according to a further embodiment.

FIG. 3 illustrates a cross-sectional view of the drift control region 360 according to a further embodiment. According to the embodiment of FIG. 3, a second semiconductor layer 260 is formed over the first semiconductor layer 105. Trenches 150 are formed in the first semiconductor layer 105. The material of the second semiconductor layer 260 is disposed in the trenches 150 so as to form the drift control region 360. According to the embodiment of FIG. 3, the drift control region 360 forms part of the second semiconductor layer 260 and is present between adjacent trenches 150. Thereby, the drift region 340 can be controlled more efficiently.

Figure 4C:
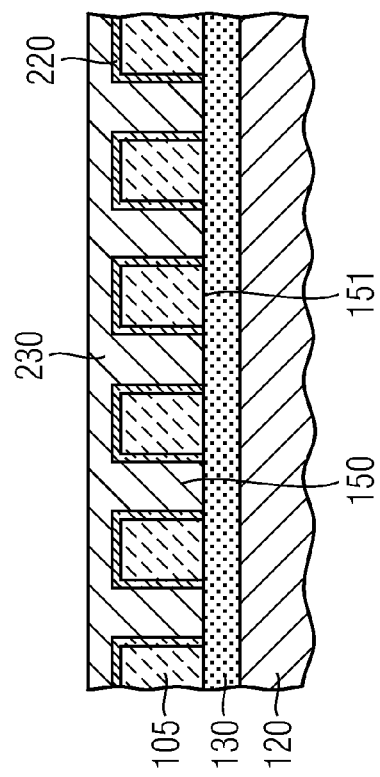

FIG. 4A to 4F illustrate a method of manufacturing a semiconductor device according to an embodiment. FIG. 4A shows an example of a starting point for manufacturing a semiconductor device according to an embodiment. An SOI (silicon on insulator) substrate 100 is taken as a starting material. The substrate 100 comprises a first semiconductor layer 105 formed over a second doped portion 120. A buried oxide layer 130 is disposed between the first semiconductor layer 105 and the second doped portion 120. A suitable hard mask layer 210 is formed over the first main surface 110 of the semiconductor substrate 100.

FIG. 4B shows a cross-sectional view of an example of a resulting structure. The hard mask layer 210 may be suitably patterned, for example, in a stripe-like manner. Thereafter, an etching step of etching silicon is performed. Silicon is etched selectively with respect to the hard mask material. For example, etching may be performed using the buried oxide layer 130 as an etching stop. As a result, trenches 150 are formed in the first semiconductor layer 105.

FIG. 4C shows an example of a resulting structure. The bottom side 151 of the trenches 150 is disposed at the same height as the surface of the buried oxide layer 130. For example, the trenches 150 may have a width of 50 to 2000 nm and a depth of 50 to 5000 nm.

Thereafter, the residues of the hard mask material are removed and a sacrificial layer 220 is formed over the remaining portions of the first semiconductor layer 105. The sacrificial layer 220 may be epitaxially grown. For example, the material of the sacrificial layer 220 may be selected so that the information about the crystal structure of the first semiconductor layer 105 is transferred to the sacrificial layer 220. For example, the material of the sacrificial layer 220 should have a similar lattice constant as the material of the first semiconductor layer 105. Further, the sacrificial layer 220 should be configured to be etched selectively with respect to the material of the first semiconductor layer 105. For example, SiGe may be selected as a material of the sacrificial layer 220. The thickness of the SiGe layer approximately corresponds to the thickness of the gate oxide of the completed semiconductor device. For example, the thickness may be approximately 10 nm to 100 nm. According to an embodiment, any material that may be epitaxially grown on the first semiconductor layer 105, and on which material a further monocrystalline layer may be epitaxially formed and which material can be selectively removed with respect to the first semiconductor layer 105 and the further monocrystalline semiconductor layer, may be used.

Thereafter, a further epitaxy method is performed so as to grow the second semiconductor layer 230. Growing the second semiconductor layer 230 is accomplished so that the crystal structure of the sacrificial layer 220 and, according to an embodiment, of the first semiconductor layer 105 is transferred to the second semiconductor 230. According to a further embodiment, the second semiconductor layer 230 may be grown as a monocrystalline layer so that a perfect crystal structure is obtained in the second semiconductor layer 230, wherein the crystal structure of the second semiconductor layer 230 is different from the crystal structure of the first semiconductor layer 105. For example, the second semiconductor layer 230 may be in-situ doped with dopants of the first conductivity type. According to a further embodiment, the second semiconductor layer 230 may be doped by implantation. The doping concentration of the second semiconductor layer 230 may be equal to, lower or higher than that of the first semiconductor layer 105.

Figure 4D:
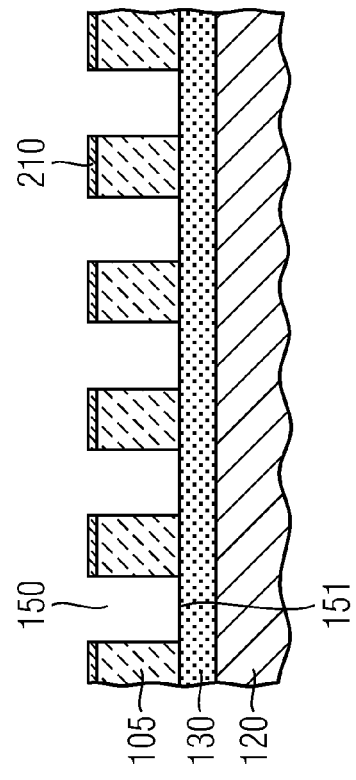

FIG. 4D shows an example of a resulting structure. Then, using a further hard mask layer 215, the second semiconductor layer 230 may be patterned. For example, the hard mask layer 215 may be etched in a stripe-like manner so as to uncover portions between adjacent trenches 150. Then, a further etching step is performed so as to etch the silicon material to remove portions of the second semiconductor layer 230 between the adjacent trenches. As a result, portions of the second semiconductor layer 230 may protrude from the trenches. According to a further embodiment, the second semiconductor layer 230 may be etched without patterning a hardmask layer, by etching the second semiconductor layer 230 selectively with respect to the sacrificial layer 220. According to this embodiment, portions of the first semiconductor layer 105 protrude from the portions of the second semiconductor layer 230. Optionally, spacers of silicon oxide or another suitable material may be formed so as to stabilize the structure. For example, the spacers may be formed so as to be adjacent to protruding portions of the second semiconductor layer 230. Further, portions of the spacer may be removed so as to form gaps between adjacent spacer portions. As a result, the spacer is segmented along the sidewalls.

Thereafter, a wet etching step is performed so as to remove the sacrificial layer 220. For example, a mixture of $HF:HNO_3$: $CH_3COOH$ may be used for etching SiGe. Due to the segmentation of the spacer, the wet etchant may reach all the portions of the SiGe-layer.

Figure 4E:
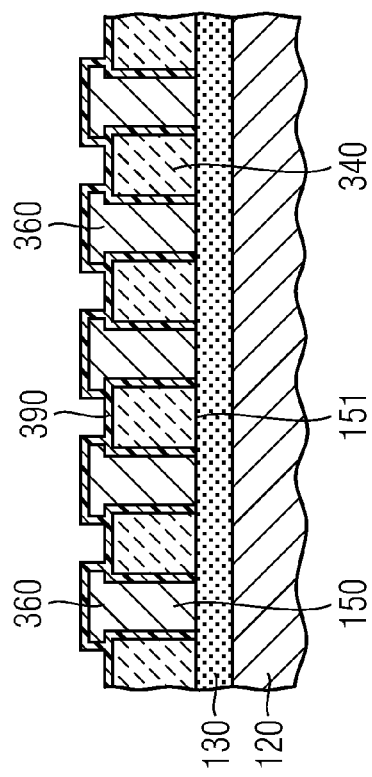

FIG. 4E shows an example of a resulting structure. As is shown, spaces 240 are disposed between portions of the first semiconductor layer 105 and portions of the second semiconductor layer 230. Thereafter, an oxidation step is performed in order to form the dielectric layer 390. For example, this may be accomplished by a thermal oxidation while feeding oxygen. The presence of voids within the dielectric layer 390 does not necessarily degrade the electrical characteristics of the device.

Figure 4F:
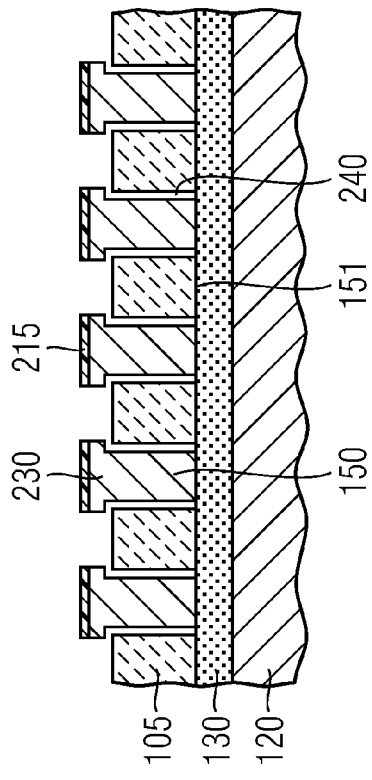

FIG. 4F shows an example of a resulting structure. Then, further processing steps may be performed so as to form the correspondingly doped portions, interconnections, metallization layers and others. Some of the processes will be explained below after describing a further embodiment illustrated in FIGS. 5A to 5D.

FIGS. 5A to 5D illustrate cross-sectional views of a substrate when performing the method according to a further embodiment. According to this embodiment, a starting point for performing the method is a semiconductor substrate comprising a first semiconductor layer 105 disposed over a second doped portion 120, without a buried oxide layer being present. Starting from a semiconductor substrate similar to the semiconductor substrate illustrated in FIGS. 4A and 4B, without a buried oxide layer 130 being present, trenches 150 are formed in the first semiconductor layer 105 using a patterned hard mask layer 210 as an etching mask. According to the embodiment, the bottom side 151 of the trenches 150 is disposed within the first semiconductor layer 105. As a consequence, in the completed semiconductor device, there will be a portion of the drift region 340 that is disposed beneath the drift control region 360.

FIG. 5A shows an example of a resulting structure. Thereafter, a sacrificial layer 220 is formed, followed by epitaxially growing the second semiconductor layer 230. The material of sacrificial layer 220 and of the second semiconductor layer 230 may be selected in a manner as previously explained with reference to the embodiment of FIGS. 4A to 4F.

FIG. 5B shows an example of a resulting structure. In the next step, the second semiconductor layer 230 is patterned, for example, using a hard mask layer. As a result, portions of the second semiconductor layer 230 are removed between adjacent trenches. Further, the remaining portions of the second semiconductor layer 230 protrude from the trenches 150. Then, spacers 235 are formed at distinctive locations of the semiconductor device. For example, the spacers 235 may be formed of an insulating material such as silicon oxide or silicon nitride which may be etched selectively with respect to the material of the first and second semiconductor layers 105, 120 and further the sacrificial layer 220. The spacers 235 are disposed adjacent to protruding portions of the remaining portions of the second semiconductor layer 230. The spacers 235 may be segmented so that there are gaps between adjacent spacers. Due to the presence of the spacers 235, the protruding portions of the second semiconductor layer 230 will be more stable after removing the sacrificial layer 220. Then, an etching step is performed to selectively remove the sacrificial layer 220 between the first semiconductor layer 105 and the second semiconductor layer 230. Due to the gaps between adjacent segments of the spacer 235, the etchant may reach all the portions of the sacrificial layer 220.

FIG. 5C shows an example of a cross-sectional view after selectively removing the sacrificial material from the device to form gaps between the second semiconductor layer 230 and the first semiconductor layer 105. As is shown, the spacers 235 stabilize the structure. Thereafter, a thermal oxidation step is performed in a similar manner as has been described above with reference of FIG. 4F. FIG. 5D shows an example of a resulting structure.

Thereafter, implantation steps are performed for forming the correspondingly doped portions of the semiconductor device. For example, the body region 330 of the second conductivity type may be formed in a portion of the first semiconductor layer 105, for example, by implantation. Moreover, the second semiconductor layer 230 may be further patterned so as to provide a dielectric layer 355 between the gate electrode 350 and the drift control region 360. Then, further implantation steps may be performed. For example, heavily doped contact implants may be formed, followed by a diffusion step. Further, source and drain regions 310, 320 may be formed by implantation.

Figure 6A:
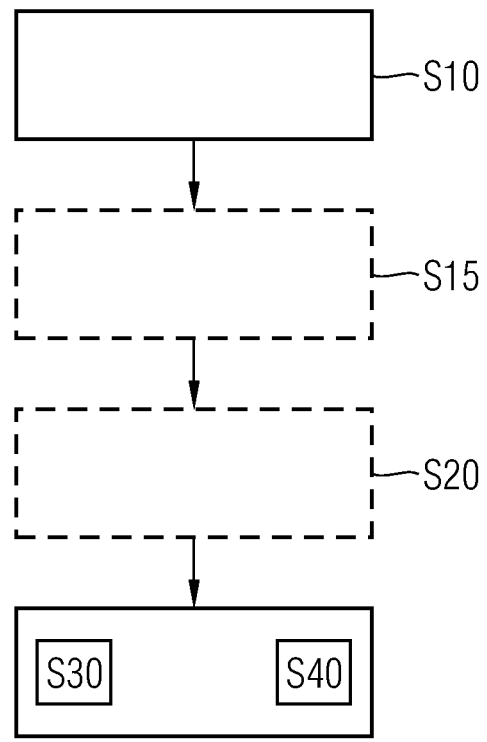

Specific processes of the method will be further explained with reference to FIG. 6A. According to an embodiment, a method of manufacturing a semiconductor device including a transistor comprises: forming trenches (S10) in a first semiconductor layer having a first main surface, the trenches extending in a first direction, the first direction being parallel to the first main surface; forming a source region in the first semiconductor layer; forming a drain region in the first semiconductor layer; forming a body region in the first semiconductor layer; and forming a drift zone in the first semiconductor layer, wherein forming the body region and the drift zone is accomplished so that the body region and the drift zone are disposed along the first direction between the source region and the drain region and between adjacent trenches. The method further comprises forming a gate electrode (S30) and a drift control region (S40) in each of the trenches so that the gate electrode is adjacent to the body region and the drift control region is arranged adjacent to the drift zone. According to an embodiment, the method may further comprise epitaxially forming a sacrificial layer over the first main surface (S15), a material of the sacrificial layer being different from the material of the first semiconductor layer, and epitaxially forming a second semiconductor layer over the sacrificial layer (S20), a material of the second semiconductor layer being different from the material of the sacrificial layer. According to the embodiment, the gate electrode and the drift control region are formed in portions of the second semiconductor layer.

FIG. 6B illustrates a method according to a further embodiment. As is shown, a method of manufacturing a semiconductor device comprising a transistor includes: forming trenches (S100) in a first semiconductor layer having a first main surface, the trenches extending in a first direction, the first direction being parallel to the first main surface; forming a sacrificial layer (S110) over the first main surface after forming the trenches, a material of the sacrificial layer being different from the material of the first semiconductor layer; epitaxially forming a second semiconductor layer over the sacrificial layer (S120), a material of the second semiconductor layer being different from the material of the sacrificial layer, removing the sacrificial layer (S130); forming a dielectric layer (S140) between the first and the second semiconductor layer; and forming a source region, a drain region, and a gate electrode (S150). The method may further comprise forming a drift control region in the second semiconductor layer. For example, the drift control region may be formed in the trenches. According to an embodiment, the gate electrode is formed in the second semiconductor layer disposed in the trenches. According to a further embodiment, the gate electrode is formed in a different layer. According to a further example, the gate electrode may be formed outside the trenches (e.g. in a planar layer over the body region) or in other trenches, different from the trenches in which the drift control region is formed.

As has been explained above, a lateral power device may be manufactured by forming trenches in a first semiconductor layer and forming a sacrificial layer over a first semiconductor layer. The material of the sacrificial layer is especially selected so that it can be grown epitaxially over the first semiconductor layer and that a second semiconductor layer may be grown epitaxially over the sacrificial layer. After epitaxially growing the second semiconductor layer over the sacrificial layer so as to fill the trenches and, optionally, patterning the second semiconductor layer, the sacrificial layer may be removed selectively with respect to the first and the second semiconductor layers. Thereafter, an oxidation process is performed to form an insulating layer between the first and the second semiconductor layers 105, 230. Due to these processing methods, it is possible to provide a semiconductor device, in which a second monocrystalline semiconductor layer is disposed in a trench, the second monocrystalline semiconductor layer being insulated from an adjacent first monocrystalline semiconductor layer by an insulating material such as silicon oxide.

Figure 7:
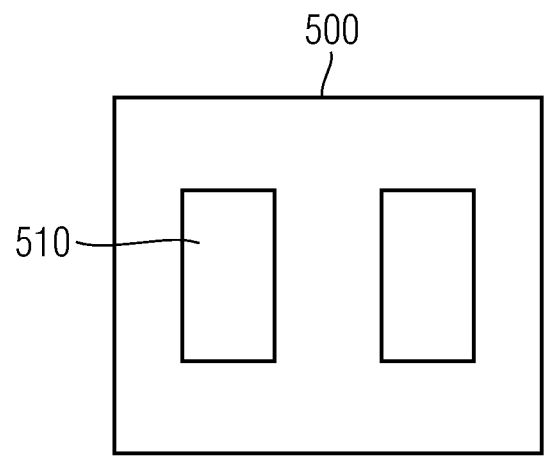
FIG. 7 illustrates an integrated circuit according to an embodiment.

FIG. 7 shows an embodiment of an integrated circuit 500 comprising a semiconductor device 510 manufactured according to one or more of the embodiments described herein and further integrated components 520. Examples of the further integrated components 520 may comprise switches, bridges and driving circuits.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device, comprising:
   a transistor, the transistor comprising a body region, a drift zone, a source region and a drain region in a first semiconductor layer having a first main surface, the body region and the drift zone being disposed between the source region and the drain region, the source region, the body region, the drift zone and the drain region being disposed along a first direction, the first direction being parallel to the first main surface;
   trenches in the first semiconductor layer and extending in the first direction,
   the transistor further comprising a dielectric layer, a gate electrode adjacent to the body region, and a drift control region adjacent to the drift zone, the drift control region and the gate electrode being disposed in the trenches, the dielectric layer being disposed between the drift region and the drift control region,
   wherein the drift control region comprises a monocrystalline semiconductor material.

2. The semiconductor device according to claim 1, wherein the gate electrode comprises a monocrystalline semiconductor material.

3. The semiconductor device according to claim 1, wherein a portion of the drift region is disposed adjacent to a bottom side of each of the trenches.

4. The semiconductor device according to claim 1, wherein portions of the drift control region protrude from the first main surface.

5. The semiconductor device according to claim 4, further comprising an insulating spacer disposed adjacent to portions of the drift control region protruding from the first main surface.

6. The semiconductor device according to claim 1, wherein the drift control regions form part of a second semiconductor layer disposed over the first semiconductor layer.

7. The semiconductor device according to claim 1, wherein the gate electrode is in contact with and electrically coupled to the drift control region.

8. The semiconductor device according to claim 1, wherein the drift control region is doped with dopants of a first conductivity type and the gate electrode is doped with dopants of a second conductivity type.

9. The semiconductor device according to claim 1, further comprising an insulating material insulating the gate electrode from the drift control region.

10. The semiconductor device according to claim 9, wherein the gate electrode is doped with dopants of a first conductivity type and the drift control region comprises a first portion doped with dopants of a second conductivity type and a second portion doped with dopants of the first conductivity type, the first portion of the drift control region being adjacent to the gate electrode.

11. The semiconductor device according to claim 3, further comprising a gate dielectric layer disposed between the gate electrode and the body region, a thickness of the gate dielectric layer being approximately equal to a thickness of the dielectric layer disposed between the drift region and the drift control region.

12. A method of manufacturing a semiconductor device comprising a transistor, the method comprising:
    forming trenches in a first semiconductor layer having a first main surface, the trenches extending in a first direction, the first direction being parallel to the first main surface;
    forming a body region, a drift zone, a source region and a drain region in a first semiconductor layer so that the body region and the drift zone are disposed between the source region and the drain region and between adjacent trenches, wherein the source region, the body region, the drift zone and the drain region are disposed along the first direction; and
    forming a gate electrode and a drift control region in each of the trenches so that the gate electrode is adjacent to the body region and the drift control region is arranged adjacent to the drift zone.

13. The method according to claim 12, further comprising:
    epitaxially forming a sacrificial layer over the first main surface after forming the trenches, a material of the sacrificial layer being different from the material of the first semiconductor layer; and
    epitaxially forming a second semiconductor layer over the sacrificial layer, a material of the second semiconductor layer being different from the material of the sacrificial layer, wherein the gate electrode and the drift control region are formed in portions of the second semiconductor layer.

14. The method according to claim 13, further comprising:
    removing the sacrificial layer; and
    forming a dielectric layer between the first and the second semiconductor layers.

15. The method according to claim 13, wherein the first and the second semiconductor layers are made of silicon and the sacrificial layer is made of Silicon-Germanium (SiGe).

16. The method according to claim 13, further comprising patterning the second semiconductor layer so that portions of the second semiconductor layer are removed from spaces between adjacent trenches.

17. The method according to claim 12, wherein the gate electrode and the drift control region are formed in a second semiconductor layer, the second semiconductor layer being disposed over the first semiconductor layer.

18. A method of manufacturing a semiconductor device comprising a transistor, the method comprising:
    forming trenches in a first semiconductor layer having a first main surface, the trenches extending in a first direction, the first direction being parallel to the first main surface;

forming a sacrificial layer over the first main surface after forming the trenches, a material of the sacrificial layer being different from the material of the first semiconductor layer;

epitaxially forming a second semiconductor layer over the sacrificial layer, a material of the second semiconductor layer being different from the material of the sacrificial layer;

removing the sacrificial layer;

forming a dielectric layer between the first and the second semiconductor layers, and forming a source region, a drain region, and a gate electrode.

19. The method according to claim 18, wherein the source region and the drain region are formed in the first semiconductor layer.

20. The method according to claim 18, further comprising forming a drift control region in the second semiconductor layer.

21. The method according to claim 18, further comprising patterning the second semiconductor layer so that portions of the second semiconductor layer are removed from spaces between adjacent trenches before removing the sacrificial layer.

22. The method according to claim 21, further comprising forming a spacer adjacent to sidewalls of the second layer after patterning the second layer.

23. The method according to claim 22, further comprising patterning the spacer so as to segment the spacer along the sidewalls.

24. A semiconductor device, comprising:

a transistor, the transistor comprising a body region, a drift zone, a source region and a drain region in a first semiconductor layer having a first main surface, the body region and the drift zone being disposed between the source region and the drain region, the source region, the body region, the drift zone and the drain region being disposed along a first direction, the first direction being parallel to the first main surface;

a trench in the first semiconductor layer and extending in the first direction, the transistor further comprising a gate electrode adjacent to the body region, the gate electrode being disposed in the trench.

* * * * *